US012223938B2

(12) United States Patent
Hrudey et al.

(10) Patent No.: US 12,223,938 B2
(45) Date of Patent: Feb. 11, 2025

(54) ACOUSTIC WAVE ATTENUATOR FOR AN ELECTRONIC DEVICE

(71) Applicant: Apple Inc., Cupertino, CA (US)

(72) Inventors: Peter C. Hrudey, San Mateo, CA (US); Gokhan Hatipoglu, Santa Clara, CA (US); Anthony D. Minervini, Gilroy, CA (US)

(73) Assignee: Apple Inc., Cupertino, CA (US)

( * ) Notice: Subject to any disclaimer, the term of this patent is extended or adjusted under 35 U.S.C. 154(b) by 266 days.

(21) Appl. No.: 17/879,411

(22) Filed: Aug. 2, 2022

(65) Prior Publication Data
US 2023/0092004 A1 Mar. 23, 2023

Related U.S. Application Data

(60) Provisional application No. 63/245,570, filed on Sep. 17, 2021.

(51) Int. Cl.
G10K 11/172 (2006.01)
B81B 3/00 (2006.01)
H04R 1/28 (2006.01)

(52) U.S. Cl.
CPC .......... G10K 11/172 (2013.01); B81B 3/0021 (2013.01); H04R 1/2873 (2013.01); G10K 2210/32272 (2013.01)

(58) Field of Classification Search
CPC .. H04R 1/2869; H04R 1/2873; B81B 3/0021; G10K 2210/32272; G10K 11/172
USPC ......................................... 181/182, 185, 175
See application file for complete search history.

(56) References Cited

U.S. PATENT DOCUMENTS

| | | | |
|---|---|---|---|
| 5,740,259 A * | 4/1998 | Dunn | H04R 1/2842 181/185 |
| 8,290,195 B2 * | 10/2012 | Chick | H04R 1/36 181/185 |
| 9,107,003 B2 | 8/2015 | Dix et al. | |
| 9,706,290 B2 | 7/2017 | Grinker | |
| 9,774,941 B2 | 9/2017 | Grinker | |
| 10,469,940 B2 | 11/2019 | Taylor et al. | |
| 2006/0157841 A1 * | 7/2006 | Minervini | H04R 19/04 257/680 |
| 2008/0217766 A1 * | 9/2008 | Minervini | H04R 19/005 257/723 |
| 2010/0303274 A1 * | 12/2010 | Ryan | H04R 1/222 381/361 |
| 2012/0033831 A1 | 2/2012 | Leitner | |

(Continued)

FOREIGN PATENT DOCUMENTS

WO 98/51122 11/1998

OTHER PUBLICATIONS

Li, Mary, et al., "Fabrication of microshutter arrays for space application," Proceedings of SPIE—The International Society for Optical Engineering, Apr. 2001, pp. 295-303.

(Continued)

Primary Examiner — Forrest M Phillips
(74) Attorney, Agent, or Firm — Aikin & Gallant, LLP

(57) ABSTRACT

An acoustic device comprising: an enclosure defining an acoustic port and an acoustic pathway between the acoustic port and a transducer coupled to the enclosure; and an array of attenuators acoustically coupled to the acoustic pathway to absorb ultrasonic acoustic waves.

20 Claims, 10 Drawing Sheets

(56) References Cited

U.S. PATENT DOCUMENTS

| | | | |
|---|---|---|---|
| 2012/0051573 A1* | 3/2012 | Litovsky | H04R 1/2873 |
| | | | 381/345 |
| 2012/0204534 A1* | 8/2012 | Kenyon | F23R 7/00 |
| | | | 60/249 |
| 2013/0223023 A1 | 8/2013 | Dehe et al. | |
| 2015/0014796 A1 | 1/2015 | Dehe | |
| 2017/0111731 A1* | 4/2017 | Merks-Swolfs | H04R 1/2838 |
| 2017/0280232 A1* | 9/2017 | Yang | H04R 1/021 |
| 2018/0233827 A1 | 8/2018 | Agranat et al. | |
| 2020/0359128 A1* | 11/2020 | Sato | H04R 1/288 |
| 2021/0105557 A1* | 4/2021 | Blore | H04R 1/2865 |
| 2022/0038813 A1* | 2/2022 | Mori | H04R 1/2888 |
| 2022/0408208 A1* | 12/2022 | Chen | H10N 30/306 |

OTHER PUBLICATIONS

Jutzi, Fabio, et al., "Low Voltage Electrostatic 90° Turning Flap for Reflective MEMS Display," 2010 International Conference on Optical MEMS & Nanphotonics, 2010, pp. 77-78.

Jhabvala, M.D., et al., "Development and operation of the microshutter array system," Proceedings of SPIE—The International Society for Optical Engineering, Apr. 2008, 13 pages.

Syms, R.R.A., et al., "Sliding-blade MEMS iris and variable optical attenuator," Journal of Micromechanics and Microengineering, vol. 14, Sep. 2004, pp. 1700-1710.

Roy, Nirupam, et al., "Inaudible Voice Commands: The Long-Range Attack and Defense," Proceedings of the 15th USENIX Symposium on Networked Systems Design and Implementation (NSDI '18), Apr. 9-11, 2018, pp. 547-560.

Jimenez, Noe, et al., "Rainbow-trapping absorbers: Broadband, perfect and asymmetric sound absorption by subwavelength panels for transmission problems," Scientific Reports, 7: 13595, Oct. 19, 2017, pp. 1-12.

\* cited by examiner

ACOUSTIC WAVE ATTENUATOR FOR AN ELECTRONIC DEVICE

CROSS-REFERENCE TO RELATED APPLICATIONS

The application is a non-provisional application of U.S. Provisional Patent Application No. 63/245,570, filed Sep. 17, 2021 and incorporated herein by reference.

FIELD

An aspect of the disclosure is directed to an array of attenuators for absorbing ultrasonic acoustic waves within an electronic device. Other aspects are also described and claimed.

BACKGROUND

Portable communications or listening devices (e.g., smart phones, earphones, etc.) have within them one or more transducers that convert an input electrical audio signal into a sound pressure wave output that can be heard by the user, or a sound pressure wave input into an electrical audio signal. The transducer (e.g., a speaker) can be used to, for example, output sound pressure waves corresponding to the voice of a far end user, such as during a telephone call, or to output sound pressure waves corresponding to sounds associated with a game or music the user wishes to play. Due to the relatively low profile of the portable devices, the transducers also have a relatively low profile, which in turn, can make it difficult to maintain optimal sound quality. In addition, ultrasonic acoustic waves emitted from environmental devices can cause sub-harmonics within the audio bandwidth of the transducer (e.g., a microphone) which are undesirable for system applications. Still further, resonances within a device can amplify the amplitude of ultrasonics, potentially increasing the amplitude of the sub-harmonics.

SUMMARY

An aspect of the disclosure is directed to an arrangement of resonators or attenuators for absorbing ultrasonic acoustic waves within an electronic device. Representatively, ultrasonic acoustic waves emitted from various devices including occupancy sensors, coffee grinders, cars, pest repellers, etc. may cause sub-harmonics within the audio bandwidth of a transducer (e.g., a microphone) which are undesirable for system applications such as active noise cancellation (ANC). Moreover, in some cases, the way transducers (e.g., microphones) are integrated into a device can cause resonances that amplify the amplitude of ultrasonics, increasing the amplitude of the sub-harmonics. Aspects of the disclosure are therefore directed to an arrangement of resonators or attenuators to attenuate (e.g., absorb) broadband ultrasonic frequencies and therefore suppress audio-band sub-harmonics. Each of the resonators or attenuators may have a particular size, geometry, volume, or the like and may be in a particular arrangement selected to attenuate different broadband ultrasonic frequencies. Representatively, in one aspect, the attenuators may be Helmholtz Resonators (HR) that are ten to forty times smaller than the ultrasonic frequency wavelength. For example, where the ultrasonic frequency wavelengths are approximately 2 centimeters or less, the HRs may have a length dimension that is 0.2 centimeters or less. In this aspect, the attenuators may be referred to herein as sub-wavelength attenuators or micro-attenuators due to their relatively small size. In some aspects, the resonators may be arranged in an array with each of the resonators spatially placed in an asymmetric stairway like pattern with complementary inverse resonators. The pattern may be selected to absorb energy in the most effective manner and enable capture of sound energy with much smaller features compared to the wavelength. The spatial distribution of the pattern and number of attenuators may be optimized to maximize the effectiveness of the attenuation. In some aspects, the pattern of attenuators may be coupled to at least two surfaces of an acoustic channel or pathway between the transducer and the acoustic port to increase absorption. For example, in some aspects, the pattern of attenuators may be arranged around the acoustic port and in some aspects formed within the substrate defining the acoustic port, such as by a micro-electro-mechanical (MEMS) processing operation. The pattern gives a unique spatial-spectral control. In addition, in still further aspects, controllable valves may be coupled to the attenuators for a dynamically tunable response to the attenuators. Moreover, in comparison to other common solutions (such as low pass filter and acoustic meshes), the attenuator arrangement disclosed herein introduces negligible phase delay within the audio-band. Such aspect is advantageous for audio signal processing algorithms, such as ANC applications.

In some aspects, an acoustic device is provided including an enclosure defining an acoustic port and an acoustic pathway between the acoustic port and a transducer coupled to the enclosure; and an array of attenuators acoustically coupled to the acoustic pathway to absorb ultrasonic acoustic waves. The array of attenuators may include a first series of attenuators arranged by volume and a second series of attenuators arranged by volume in inverse order to that of the first series of attenuators. The array of attenuators may include a first series of attenuators arranged by a frequency of ultrasonic acoustic waves they are dimensioned to absorb and a second series of attenuators arranged by a frequency of ultrasonic acoustic waves they are dimensioned to absorb in inverse order to the first series of attenuators. In some aspects, the array of attenuators comprises a first series of attenuators arranged by a dimension and a second series of attenuators may be arranged by a dimension in inverse order to that of the first series of attenuators. In some aspects, the dimension is a length dimension, and the first series of attenuators are arranged in a first column by increasing length and the second series of attenuators are arranged in a second column adjacent to the first column by decreasing length. In some aspects, each of the attenuators of the array of attenuators comprise a body portion acoustically coupled to the acoustic pathway by a neck portion, and wherein a length dimension of the body portion of each of the attenuators is different from that of an adjacent attenuator. In some aspects, the length dimension is at least ten times smaller than at least one of the ultrasonic acoustic waves. The array of attenuators may include a first column of attenuators, a second column of attenuators arranged in an inverse order to the first column of attenuators, and a third column of attenuators arranged in an inverse order to the second column of attenuators. In some aspects, the array of attenuators is a first array of attenuators acoustically coupled to a first side of the acoustic pathway, and the device further comprises a second array of attenuators acoustically coupled to a second side of the acoustic pathway. In some aspects, the transducer is a microphone and the array of attenuators absorbs ultrasonic acoustic waves within a frequency range of from 20 kHz to 100 kHz.

In another aspect, an acoustic device is provided including an enclosure defining an acoustic port and an acoustic pathway between the acoustic port and a transducer coupled to the enclosure; and a first series of attenuators and a second series of attenuators asymmetrically arranged relative to one another along the acoustic pathway to absorb ultrasonic acoustic waves. In some aspects, the first series of attenuators and the second series of attenuators each comprise at least two attenuators dimensioned to absorb ultrasonic acoustic waves within different frequency ranges, and the at least two attenuators of the first series of attenuators are in inverse order to that of the at least two attenuators of the second series of attenuators. In some aspects, each of the attenuators of the first series of attenuators are arranged according to a length dimension and each of the attenuators of the second series of attenuators are arranged according to a length dimension in an order inverse to that of the first series of attenuators. In some aspects, the first series of attenuators and the second series of attenuators are arranged along a first side of the acoustic pathway, and the device further comprises a third series of attenuators arranged along the first side of the acoustic pathway in an order inverse to that of the second series of attenuators. In some aspects, a fourth series of attenuators and a fifth series of attenuators arranged along a second side of the acoustic pathway are further provided.

In some aspects, a method of manufacturing a transducer assembly is further provided including providing a transducer assembly having a substrate defining an acoustic pathway to an acoustic port; and coupling an arrangement of attenuators to the substrate to absorb ultrasonic acoustic waves within the acoustic pathway. In some aspects, the arrangement of attenuators comprise Helmholtz resonators formed within the substrate, wherein the Helmholtz resonators are dimensioned to absorb ultrasonic acoustic waves within at least two different frequency ranges. The arrangement of attenuators may include an array of attenuators formed in an insert piece and the insert piece is attached to the substrate. In some aspects, the insert piece is attached to a top side or a bottom side of the substrate. In other aspects, the insert piece is embedded within the substrate.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect in this disclosure are not necessarily to the same aspect, and they mean at least one.

DETAILED DESCRIPTION

In this section we shall explain several preferred aspects of this disclosure with reference to the appended drawings. Whenever the shapes, relative positions and other aspects of the parts described are not clearly defined, the scope of the disclosure is not limited only to the parts shown, which are meant merely for the purpose of illustration. Also, while numerous details are set forth, it is understood that some aspects of the disclosure may be practiced without these details. In other instances, well-known structures and techniques have not been shown in detail so as not to obscure the understanding of this description.

The terminology used herein is for the purpose of describing particular aspects only and is not intended to be limiting of the disclosure. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
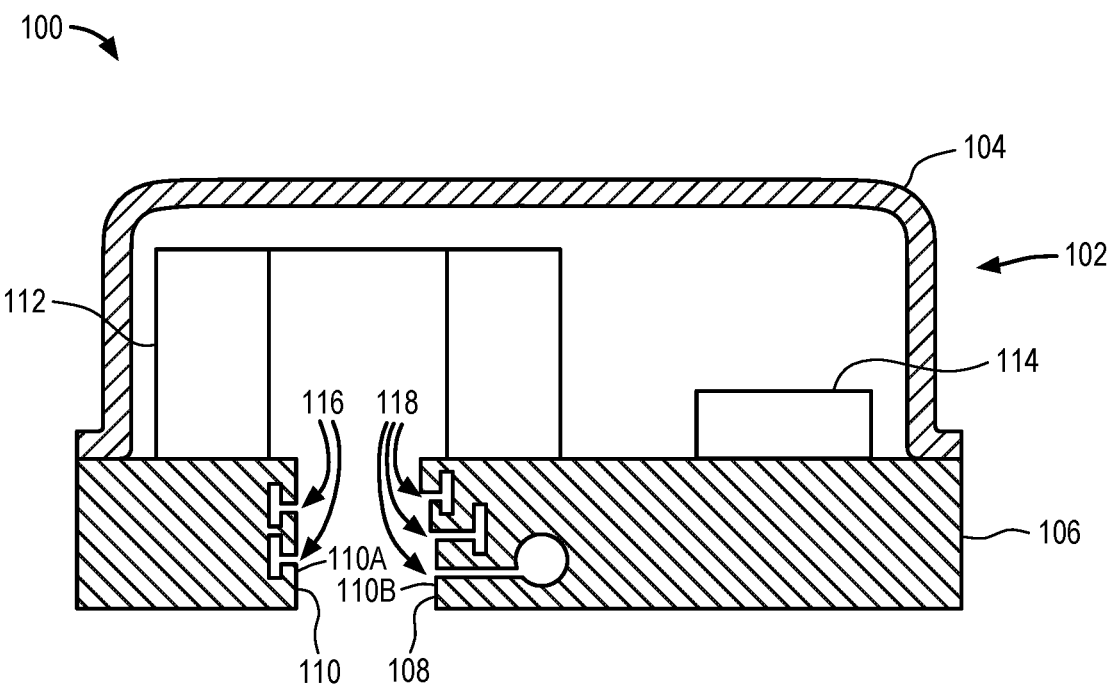
FIG. 1 illustrates a cross-sectional side view of one aspect of a transducer assembly having an arrangement of attenuators.

FIG. 1 illustrates a cross-sectional side view of one aspect of a transducer assembly and/or a transducer assembly integrated within a portable electronic device. Representatively, the device or assembly 100 may include a housing, casing or enclosure 102 that defines or closes off a chamber in which the constituent electronic components of the transducer assembly or electronic device are contained. Enclosure 102 may include an enclosure wall, which may include or be formed by, a lid 104 and a substrate 106 that together form an encased space or interior chamber within enclosure 102 that is separated from the surrounding environment. In some cases, the enclosure 102 completely isolates or seals the interior chamber from the surrounding environment. For example, the enclosure wall may form a water-proof or acoustically isolated interior chamber which is impermeable to water and/or air. In other aspects, the enclosure wall may also include a barometric vent ("b-vent") or other type of vent (not shown) that connects the interior chamber to the surrounding environment to help relieve and/or equalize pressure changes within the interior chamber. The interior chamber may be of a sufficient volume and/or size to accommodate the constituent components of assembly 100. For example, components of transducer 112 and ASIC 114 may be contained within the interior chamber formed by enclosure 102. In some aspects, transducer 112 may, for example be an electro-acoustic transducer such as a microphone that converts sound into an electrical signal for further processing by the device. It should further be understood that while a component such as a transducer 112 is illustrated, in other aspects, the component may be another type of device or sensor, for example, a speaker or a pressure sensor. The enclosure 102 may further include an acoustic port 108 and an acoustic pathway 110 acoustically connecting transducer 112 to acoustic port 108. The enclosure acoustic port 108 may be, for example, a sound input or output port that allows sound to travel between the ambient environment and transducer 112 positioned within interior chamber. For example, in aspects where transducer 112 is a microphone, acoustic port 108 may be a sound input port that allows for input of sound to the microphone. In some aspects, transducer 112 may be a MEMS microphone and each of the components may be formed using MEMS processing operations.

Enclosure 102 may further include an arrangement of resonators or attenuators 116, 118. Attenuators 116, 118 may be positioned between acoustic port 108 and transducer 112 and have a particular size, geometry, volume, etc. and/or be in a particular arrangement selected to attenuate different broadband ultrasonic frequencies. For example, in some aspects, one or more of attenuators 116, 118 may be Helmholtz Resonators (HR) that are ten to forty times smaller than the ultrasonic frequency wavelength. Attenuators 116 may be arranged along a first side 110A of the acoustic pathway 110 and attenuators 118 may be arranged along a second side 110B of the acoustic pathway 110. Although not shown, any one or more additional attenuators may be arranged along an additional side of the acoustic pathway 110, and in turn, the acoustic port 108. In some aspects, attenuators 116, 118 may be arranged, in any array or another pattern particularly selected to attenuate ultrasonic acoustic waves. For example, attenuators 116, 118 may be arranged in an array or pattern selected to attenuate a frequency range of about 20 kHz or more, or about 25 kHz or more, or about 20 kHz to about 100 kHz, or about 35 Hz to about 80 kHz. In this aspect, attenuators 116, 118 will attenuate frequencies within ranges found to cause sub-harmonics within the audio bandwidth of transducer 112 while allowing the lower, more desirable frequencies (e.g., frequencies less than around 20 kHz, 25 kHz, or 35 kHz), to pass to transducer 112. Attenuators 116, 118 may, in some aspects, be formed within the portions of substrate 106 defining the acoustic pathway 110 and/or acoustic port 108. For example, attenuators 116, 118 may be formed in substrate 106 using MEMS processing operations. In other aspects, attenuators 116, 118 may be formed in substrate 106 by an injection or inverse molding process or using a three-dimensional (3D) printing process.

Figure 2:
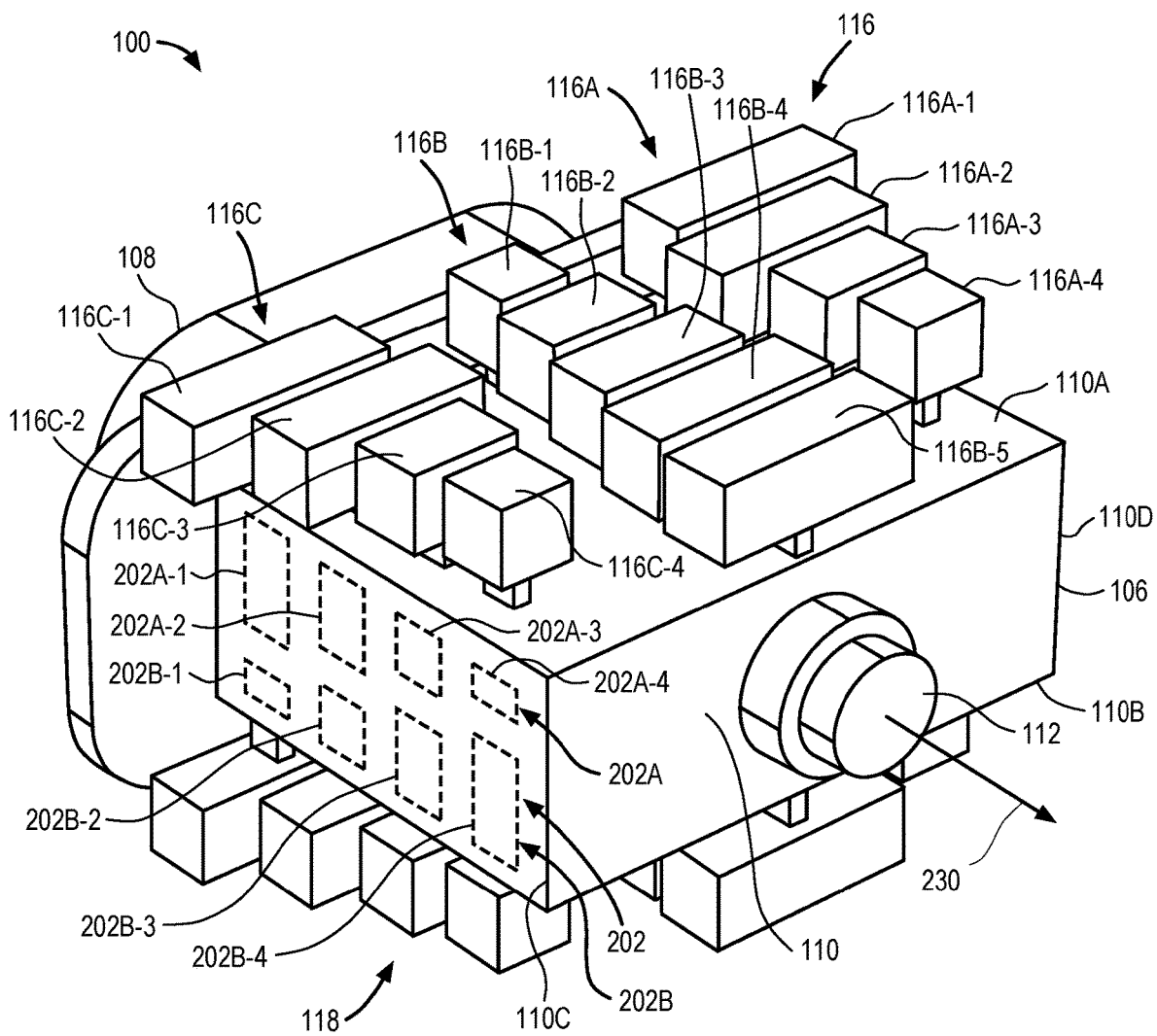
FIG. 2 illustrates a perspective view of one aspect of an arrangement of attenuators for a transducer assembly.

FIG. 2 illustrates a perspective magnified view of one representative arrangement of attenuators for device or assembly 100. Representatively, as can be seen from FIG. 2, assembly 100 may include attenuators 116, 118 formed in, or otherwise coupled to, portions of substrate 106 forming the acoustic pathway 110 between port 108 and transducer 112. Although attenuators 116, 118 are described as being formed in portions of substrate 106, it should be understood that they may be formed in, or otherwise coupled to, any portion of enclosure 102 that provides an acoustic pathway or acoustic port for the transducer 112. As can further be seen from FIG. 2, the arrangement of attenuators 116 may be along first side 110A (e.g., top side) of acoustic pathway 110 and the arrangement of attenuators 118 may be along second side 110B (e.g., bottom side) of acoustic pathway 110. In the illustrated configuration, first side 110A may be an opposite side to second side 110B. Acoustic pathway 110 may also include third side 110C and fourth side 110D (e.g., side walls) that are opposite to one another, and connect the first and second sides 110A, 110B together, to form the pathway 110. Although attenuators 116, 118 are described as formed along first and second sides 110A-B, it should be understood that they may be formed along any of sides 110A-D.

Referring now in more detail to the arrangement of attenuators 116, attenuators 116 may be understood as being arranged in an array in that the attenuators are arranged in a number of rows and columns along the side 110A. In some aspects, the rows may be considered the arrangement of attenuators running perpendicular to the pathway axis 230 and the columns may be considered the arrangement of attenuators running parallel to the pathway axis 230. In other aspects, attenuators 116 may be considered arranged in a pattern, or repeating pattern, including multiple rows, columns or other repeating arrangements. Representatively, the arrangement of attenuators 116 may form a first column 116A, a second column 116B and a third column 116C along the side 110A. First column 116A may be made up of attenuators 116A-1, 116A-2, 116A-3 and 116A-4. Second column 116B may be made up of attenuators 116B-1, 116B-2, 116B-3, 116B-4 and 116B-5. Third column 116C may be made up of attenuators 116C-1, 116C-2, 116C-3 and 116C-4. In addition, each of attenuators 116A-1, 116B-1 and 116C-1 may be considered arranged in a first row, attenuators 116A-2, 116B-2, 116C-2 may be considered arranged in a second row, attenuators 116A-3, 116B-3, 116C-3 may be considered arranged in a third row, attenuators 116A-4, 116B-4, 116C-4 may be considered arranged in a fourth row, and attenuator 116B-5 is in a fifth row. In some aspects, each of the attenuators making up columns 116A, 116B and 116C may be considered arranged in series in that they are arranged in a particular order based on a particular parameter. For example, the attenuators may be arranged in order by volume, geometry, size, shape, or any other parameter that is different among the attenuators or otherwise allows them to absorb different frequency ranges. Representatively, in the illustrated configuration, each of the attenuators making up columns 116A, 116B and 116C may be understood as each having a different length dimension or volume than other attenuators within the same column, and may therefore be considered arranged in series in order of the length dimension or volume. Due to their different parameters, each of the attenuators may absorb different frequency ranges, therefore together they are able to attenuate broadband ultrasonic frequencies, for example, within a range of from about 25 kHz to about 80 kHz. In addition, in some aspects, adjacent columns of attenuators may be considered asymmetrically or inversely arrange relative to one another. This arrangement has been found to absorb the energy in the most effective manner and enables the capture of sound energy using attenuators much smaller than the wavelength. Moreover, this arrangement has been found to introduce negligible phase delay within the audio-band, which is advantageous for audio signal processing algorithms, such as ANC applications.

Representatively, attenuators 116A-1 to 116A-4 making up column 116A may be arranged in series in order of decreasing length or volume. In other words, attenuator 116A-1 closest to port 108 has the largest length or volume while attenuator 116A-4 closest to transducer 112 has the smallest length or volume. Attenuators 116B-1 to 116B-5 making up the adjacent column 116B, on the other hand, may be arranged in order of increasing length or volume. In other words, attenuator 116B-1 closest to port 108 has the smallest length or volume while attenuator 116B-5 closest to transducer 112 has the largest length or volume. Finally, attenuators 116C-1 to 116C-4 making up column 116C, which is adjacent to column 116B, may be arranged in order of decreasing length or volume. In this aspect, attenuator 116C-1 closest to port 108 has the largest length or volume while attenuator 116C-4 closest to transducer 112 has the smallest length or volume. Although not shown, the arrangement of attenuators 118 may be a mirror image of the arrangement of attenuators 116.

In addition, in some aspects, an arrangement of attenuators 202 may optionally be positioned along a third side 110C (and/or a fourth side 110D) as illustrated by the dashed lines. Similar to the arrangement of attenuators 116, 118, the arrangement of attenuators 202 may be in an array which includes at least two columns and two rows of attenuators arranged in series. For example, the arrangement of attenuators 202 may include a first column 202A and a second column 202B. The first column 202A may be made up of attenuators 202A-1, 202A-2, 202A-3 and 202A-4 arranged in order of decreasing length or volume. The second column 202B may be made up of attenuators 202B-1, 202B-2, 202B-3 and 202B-4 arranged in order of increasing length or volume. It should further be understood that while only two or three columns and four or five rows are illustrated in the arrangement of attenuators 116, 118, 202, the array may include more columns and/or rows where more attenuation is desired.

Figure 3:
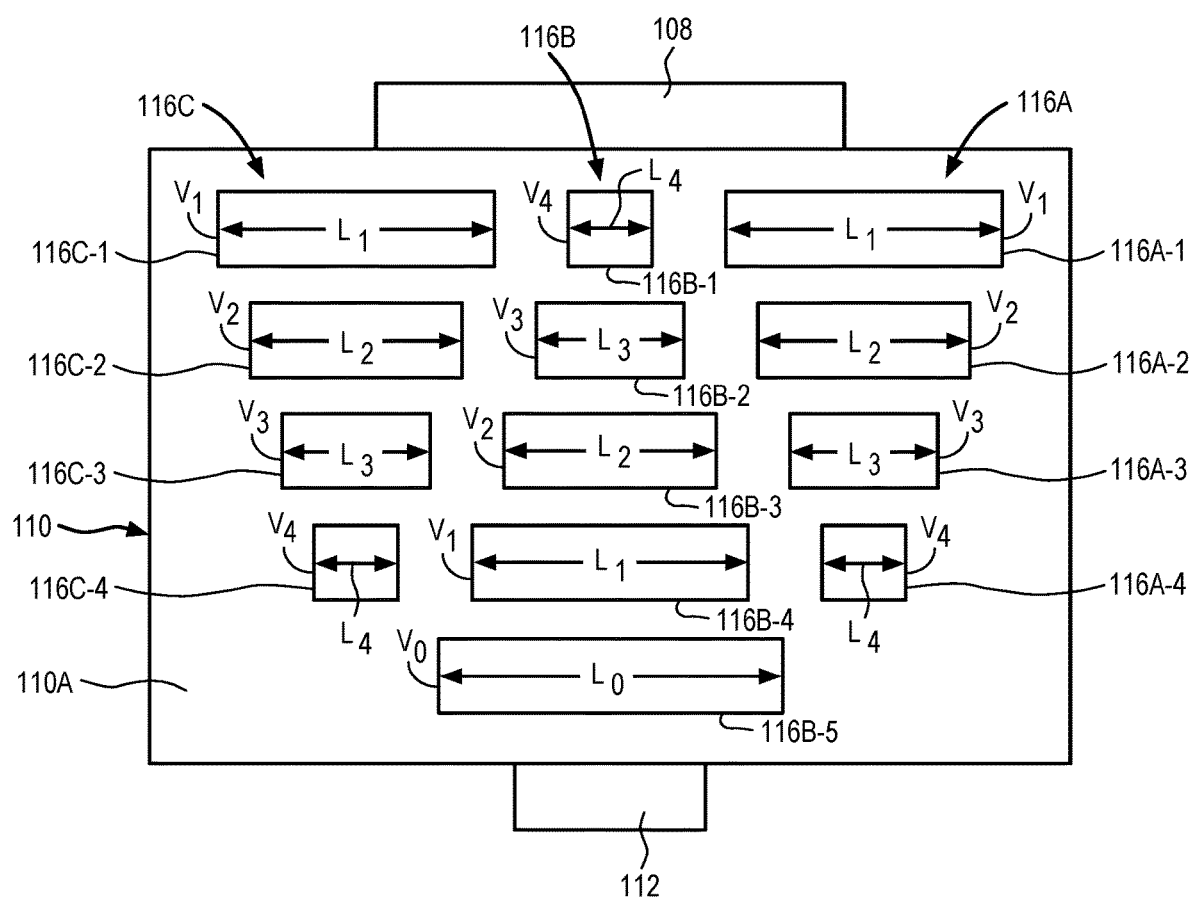
FIG. 3 illustrates a top plan view of one aspect of an arrangement of attenuators for a transducer assembly.

Referring now in more detail to aspects of each of the attenuators making up the arrangements, FIG. 3 is a top plan view of attenuators 116 positioned along first side 110A. From this view, it can be seen that the attenuators making up the arrangement of attenuators 116 are arranged according to a length dimension or a volume. In addition, in the illustrated arrangement, it can be seen that a length dimension of each of the attenuators is different from that of an adjacent attenuator. Representatively, referring now to first column 116A, attenuator 116A-1 has a length (L1), attenuator 116A-2 has a length (L2), attenuator 116A-3 has a length (L3) and attenuator 116A-4 has a length (L4) where L4<L3<L2<L1. Attenuators 116A-1 to 116A-4 may therefore be considered arranged in first column 116A in series by decreasing length, wherein the longest attenuator (116A-1) is near the port 108 and the shortest attenuator (116A-4) is near transducer 112. Referring now to second column 116B, attenuator 116B-1 has a length (L4), attenuator 116B-2 has a length (L2), attenuator 116B-3 has a length (L3), attenuator 116A-4 has a length (L4), and attenuator 116A-5 has a length (L0) where L4<L3<L2<L1<L0. Attenuators 116B-1 to 116B-5 may therefore be considered arranged in second column 116B in series by increasing length, wherein the shortest attenuator (116B-1) is near the port 108 and the longest attenuator (116B-5) is near transducer 112. In other words, the series of attenuators 116B-1 to 116B-5 making up column 116B are arranged in an order inverse to that of the series of attenuators 116A-1 to 116A-4 making up column 116A. In addition, in some aspects, the arrangement of columns 116A and 116B may be considered asymmetrical. For example, column 116A lacks symmetry with column 116B. Referring now to third column 116C, attenuator 116C-1 has a length (L1), attenuator 116C-2 has a length (L2), attenuator 116C-3 has a length (L3) and attenuator 116C-4 has a length (L4) where L4<L3<L2<L1. Attenuators 116C-1 to 116C-4 may therefore be considered arranged in third column 116C in series by decreasing length, wherein the longest attenuator (116C-1) is near the port 108 and the shortest attenuator (116C-4) is near transducer 112. In other words, the series of attenuators 116C-1 to 116C-4 making up column 116C are arranged in an order inverse to that of the series of attenuators 116B-1 to 116B-5 making up column 116B. In addition, the arrangement of columns 116C and 116B may be considered asymmetrical. For example, column 116C lacks symmetry with column 116B. It should further be understood that in some aspects, the length dimensions (L1-L5) may be ten to forty times smaller than the ultrasonic acoustic wavelength they are configured to absorb. For example, where the wavelength to be absorbed is within a range of two centimeters or less, the length dimension (L1-L5) may be ten to forty times smaller than a wavelength within this range.

In addition, it should be understood that while different length dimensions (L0-L5) are described, each of the attenuators having a different length may also be understood as having different volumes (V0-V5). Thus, the attenuators making up the arrangement of attenuators 116 may also be understood as being arranged according to volume. Representatively, referring now to first column 116A, attenuator 116A-1 has a volume (V1), attenuator 116A-2 has a volume (V2), attenuator 116A-3 has a volume (V3) and attenuator 116A-4 has a volume (V4) where V4<V3<V2<V1. Attenuators 116A-1 to 116A-4 may therefore be considered arranged in first column 116A in series by decreasing volume, wherein the attenuator (116A-1) with the largest volume is near the port 108 and the attenuator (116A-4) with the smallest volume is near transducer 112. Referring now to second column 116B, attenuator 116B-1 has a volume (V4), attenuator 116B-2 has a volume (V2), attenuator 116B-3 has a volume (V3), attenuator 116A-4 has a volume (V4), and attenuator 116A-5 has a volume (V0) where V4<V3<V2<V1<V0. Attenuators 116B-1 to 116B-5 may therefore be considered arranged in second column 116B in series by increasing volume, wherein the smallest attenuator (116B-1) is near the port 108 and the largest attenuator (116B-5) is near transducer 112. In other words, the series of attenuators 116B-1 to 116B-5 making up column 116B are arranged in an order inverse to that of the series of attenuators 116A-1 to 116A-4 making up column 116A. In addition, the arrangement of columns 116A and 116B may be considered asymmetrical. For example, column 116A lacks symmetry with column 116B. Referring now to third column 116C, attenuator 116C-1 has a volume (V1), attenuator 116C-2 has a volume (V2), attenuator 116C-3 has a volume (V3) and attenuator 116C-4 has a volume (V4) where V4<V3<V2<V1. Attenuators 116C-1 to 116C-4 may therefore be considered arranged in third column 116C in series by decreasing volume, wherein the largest attenuator (116C-1) is near the port 108 and the smallest attenuator (116C-4) is near transducer 112. In other words, the series of attenuators 116C-1 to 116C-4 making up column 116C are arranged in an order inverse to that of the series of attenuators 116B-1 to 116B-5 making up column 116B. In addition, the arrangement of columns 116C and 116B may be considered asymmetrical. For example, column 116C lacks symmetry with column 116B.

In addition, it should be understood that each of the attenuators having a different length (L0-L5) or volume (V0-V5) will absorb a different frequency range, therefore each of the attenuators may be considered arranged in series according to the frequency range they can absorb. Representatively, the smaller attenuators (e.g., attenuators 116A-4, 116B-1 and 116C-4) may be tuned to absorb higher frequency ranges (e.g., frequencies closer to 80 kHz or up to 100 kHz or higher) while the larger attenuators (e.g., attenuators 116A-1, 116B-5 and 116C-1) may be tuned to absorb lower frequency ranges (e.g., frequencies closer to 20 kHz or 25 kHz). For example, in one aspect, attenuator 116B-5 may absorb acoustic waves within a frequency range of from about 20 kHz or 25 kHz to about 35 kHz, attenuators 116A-1, 116B-4 and 116C-1 may absorb acoustic waves within a frequency range of from about 36 kHz to about 46 kHz, attenuators 116A-2, 116B-3 and 116C-2 may absorb acoustic waves within a frequency range of from about 47 kHz to about 57 kHz, attenuators 116A-3, 116B-2 and 116C-3 may absorb acoustic waves within a frequency range of from about 58 kHz to about 68 kHz, and attenuators 116A-4, 116B-1 and 116C-4 may absorb acoustic waves within a frequency range of from about 69 kHz to about 80 kHz. It should further be understood that while an array of attenuators 116 including three columns and two rows made up of a number of attenuators of a similar shape, other arrangements, patterns, shapes and/or dimensions are contemplated.

Figure 4:
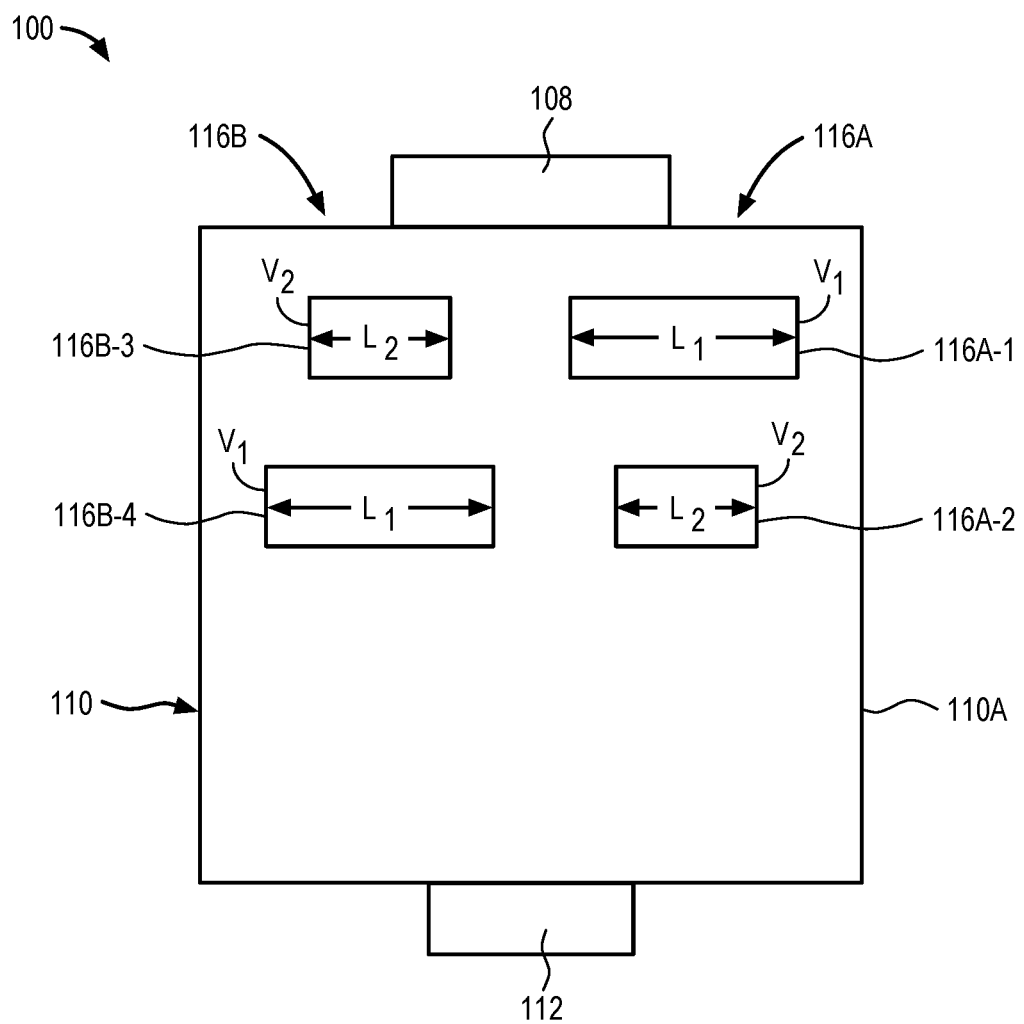
FIG. 4 illustrates a top plan view of one aspect of an arrangement of attenuators for a transducer assembly.

Representatively, FIG. 4 illustrates another arrangement of attenuators. In this configuration, the attenuators are arranged in a two by two array along the first side 110A of the acoustic pathway 110 between port 108 and transducer 112. Representatively, the array may include a first series or column 116A of attenuators 116A-1 and 116A-2 and a second adjacent series or column 116B of attenuators 116B-3 and 116B-4. Similar to the attenuators described in reference to FIG. 3, attenuators 116A-1 and 116A-2 of column 116A may have different lengths (L1, L2) and/or volumes (V1, V2) and be arranged in series by decreasing length or volume. Attenuators 116B-3 and 116B-4 of column 116B may have different lengths (L2, L1) and/or volumes (V1, V2) and be arranged by increasing length or volume. Attenuators 116B-3 and 116B-4 making up column 116B may therefore be considered arranged in series in an order inverse to that of attenuators 116A-1 and 116A-2 making up column 116A. Although not shown, a similar attenuator arrangement or pattern may be found on the second side (e.g., side 110B), or any other side, of pathway 110. In addition, it should be understood that each of sides 110A-C may have a same or different arrangement, pattern or number of attenuators depending on the desired attenuation. It should further be understood that as previously discussed, due to their different parameters, each of the attenuators making up any of the previously discussed arrangements or patterns, may absorb different frequency ranges, therefore together they are able to attenuate broadband ultrasonic frequencies, for example, within a range of from about 20 kHz to about 100 kHz, or from about 25 kHz to about 80 kHz. These arrangements have been found to absorb the energy in the most effective manner and enables the capture of sound energy using attenuators much smaller than the wavelength, while introducing negligible phase delay within the audio-band.

Figure 5A:
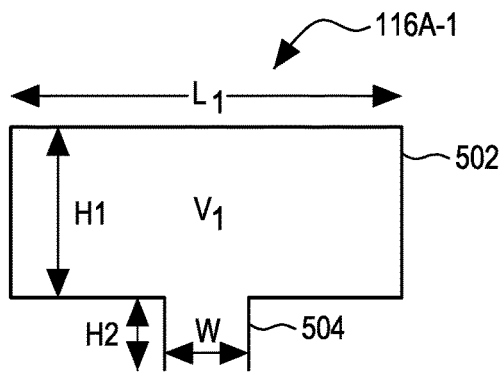
FIG. 5A illustrates a cross-sectional side view of one aspect of an attenuator.
Figure 5B:
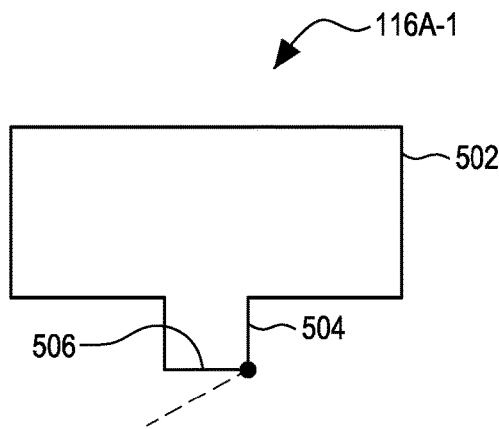
FIG. 5B illustrates a cross-sectional side view of the attenuator of FIG. 5A including a valve.

Referring now to FIG. 5A, FIG. 5B, FIG. 5C, FIG. 5D, FIG. 5E, FIG. 6, FIG. 7, FIG. 8 and FIG. 9, FIGS. 5A-FIG. 9 illustrate a number of different attenuator configurations. Representatively, FIG. 5A and FIG. 5B show an attenuator 116A-1 which includes a body portion 502 and a neck portion 504. The neck portion 504 may connect the body portion 502 to the acoustic pathway or port in which attenuation is desired. Representatively, neck portion 504 may be connected to the previously discussed pathway 110 or port 108. The body portion 502 and the neck portion 504 may together define a chamber having a volume (V1) that is, in turn, open to the pathway or port attenuator 116A-1 is connected to. The body portion 502 and the neck portion 504 may have different shapes and sizes depending on the desired volume (V1) and/or frequency range the attenuator 116A-1 is intended to absorb. In some aspects, the body portion 502 may generally be larger (or define a greater volume) than the neck portion 504. In the illustrated configuration, the body portion 502 is a rectangular shaped structure having a length dimension (L1), a height dimension (H1), and may also have a width dimension (although not shown). At least one of the dimensions of the body portion 502 may be selected, or adjusted, to achieve a volume (V1) that absorbs a desired frequency range. For example, in some aspects, the length dimension (L1) may be selected and/or changed to correspond to any one of the previously discussed lengths (L0-L5) to achieve a desired volume (V1) for attenuating a particular frequency range. Representatively, the length dimension (L1) may be around ten to forty times smaller than the ultrasonic acoustic wavelength. For example, if the ultrasonic wavelength is two centimeters or less, the length dimension (L1) may be 0.2 centimeters or less, or from about 0.05 centimeters to 0.2 centimeters. The neck portion 504 may have a height dimension (H2) and a width dimension (W). The neck portion 504 may be narrower than the body portion (e.g., W<L1). In some aspects, the width dimension (W) may be understood as defining the size of the neck opening. In some aspects, at least one of the dimensions of the body portion 502 and/or the neck portion 504 may be selected, or adjusted, to achieve a volume (V1) that absorbs a desired frequency range. For example, in some aspects, the height dimension (H1) or the width dimension (W) of body portion 502, or the height dimension (H2) or the width dimension (W) of neck 504 may be selected and/or changed to achieve a desired volume (V1) for attenuating a particular frequency range. In other cases, other aspects of the attenuator 116A-1 may be selected, adjusted and/or changed so that the attenuator absorbs the desired frequency range. Representatively, in some aspects, the attenuators may have dampers for low frequency attenuation.

FIG. 5B illustrates attenuator 116A-1 of FIG. 5A, however, with a valve 506 connected to neck 504. Valve 506 may be any type of controllable valve operable to open or close the opening to neck 504. For example, valve 506 may be a mechanical or electromechanical valve having a dynamically tunable response to the attenuator 116A-1. In this aspect, valve 506 may be caused to open or close depending on a desired level of attenuation. Representatively, when the valve 506 is in the open configuration, the attenuator 116A-1 is open to the acoustic pathway or port for attenuation of a desired frequency range. When the valve 506 is in the closed configuration, the attenuator 116A-1 is closed off from the acoustic pathway or port. In some aspects, each of the attenuators making up the attenuator arrangements may have a valve 506 that either opens or closes the attenuator to the acoustic pathway or port depending on the desired level of attenuation. In addition, in some aspects, valve 506 may be operable to partially open and/or close neck 504. In this aspect, valve 506 can be used to change the width (W) of neck 504 to fine tune the frequency of each block within the band stop bandwidth. Representatively, the attenuator band stop bandwidth can be extended into the audioband to suppress the first resonance peak as well as the peaks in the ultrasound in order to obtain a flat-frequency response of the acoustic sensor (e.g., the microphone will have a flat frequency response between 35 Hz-80 kHz). This way the operational bandwidth of the acoustic sensor is improved.

Figure 5C:
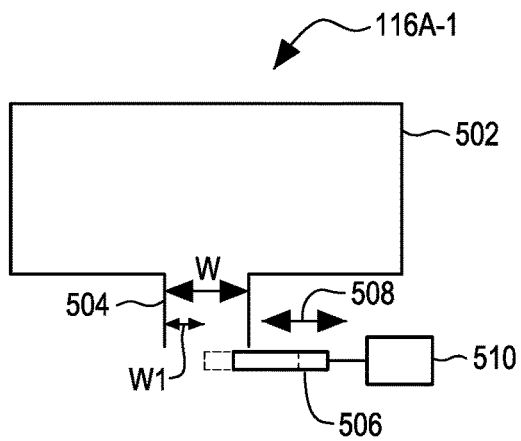
FIG. 5C illustrates a cross-sectional side view of the attenuator of FIG. 5A including a valve.

FIG. 5C illustrates a cross-sectional side view of the attenuator of FIG. 5A including another aspect of a valve. Representatively, similar to FIG. 5B, FIG. 5C illustrates attenuator 116A-1 with a valve 506 connected to neck 504. In this configuration, however, valve 506 is a slider mechanism that is operable to open or close the opening to neck 504. For example, valve 506 may be a mechanical or electromechanical slider mechanism that moves in the direction of arrow 508 to tune a width of neck 504. Representatively, the slider mechanism valve 506 may be coupled to an actuator 510 that drives a movement of the slider mechanism valve 506 in a direction of arrow 508 to increase a width (see, e.g., width (W)) or decrease a width (see, e.g., width (W1) of neck 504. For example, when slider mechanism valve 506 is in the open configuration, neck 504 is completely open and has a width (W). When slider mechanism valve 506 is caused to slide to the left as illustrated by the dashed line, neck 504 is only partially open and has a width (W1). It should further be understood that while two neck widths (W) and (W2) are illustrated, slider mechanism valve 506 is operable to move to any position across neck 504 to achieve any desired neck width. In this aspect, slider mechanism valve 506 can be used to fine tune the frequency of each block within the band stop bandwidth. In addition, in some aspects, slider mechanism valve 506 may be part of actuator 510 and actuator 510, may be, but is not limited to, an electrostatic, electromagnetic, piezoelectric, or thermal actuator.

Figure 5D:
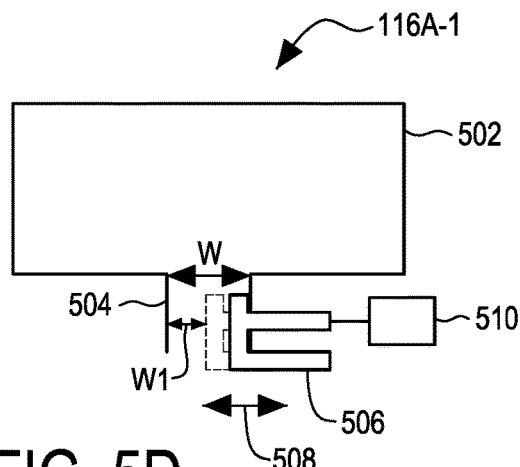
FIG. 5D illustrates a cross-sectional side view of the attenuator of FIG. 5A including a valve.

FIG. 5D illustrates a cross-sectional side view of the attenuator of FIG. 5A including a further aspect of a valve. Representatively, similar to FIG. 5C, FIG. 5D illustrates attenuator 116A-1 with valve 506 connected to neck 504. In this configuration, however, valve 506 is a slider mechanism having an "L" shape that is operable to open or close the opening to neck 504. For example, valve 506 may be a mechanical or electromechanical "L" shaped slider mechanism that moves in the direction of arrow 508 to tune a width of neck 504. Representatively, the slider mechanism valve 506 may be coupled to actuator 510 that drives a movement of the slider mechanism valve 506 in a direction of arrow 508 to increase a width (see, e.g., width (W)) or decrease a width (see, e.g., width (W1) of neck 504. For example, when the "L" shaped slider mechanism valve 506 is in the open configuration, neck 504 is completely open and has a width (W). When the "L" shaped slider mechanism valve 506 is caused to slide to the left as illustrated by the dashed line, neck 504 is only partially open and has a width (W1). It should further be understood that while two neck widths (W) and (W2) are illustrated, slider mechanism valve 506 is operable to move to any position across neck 504 to achieve any desired neck width and tune the frequency of each block within the band stop bandwidth.

Figure 5E:
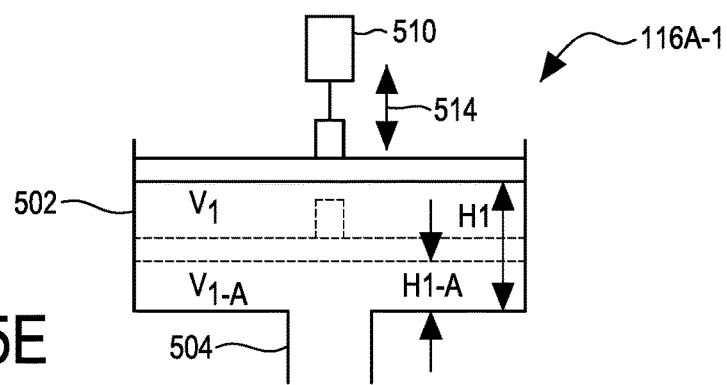
FIG. 5E illustrates a cross-sectional side view of the attenuator of FIG. 5A including a piston.

FIG. 5E illustrates a cross-sectional side view of the attenuator 116A-1 of FIG. 5A, however, with a piston 512 connected to the body portion 502 to tune the chamber size or volume (V1). Representatively, piston 512 may positioned within the chamber of body portion 502 and caused to move in a direction of arrow 514 by actuator 510 to change the chamber size or volume (V1). For example, in one aspect, piston 512 may be considered to be in an upper most position such that the body portion 502 has substantially the same height (H1) as described in reference to FIG. 5A (e.g., configuration without a piston). In another aspect, actuator 510 may drive piston 512 in a direction of arrow 514 to a lower most position as illustrated by the dashed line such that body portion 502 has a reduced height (H1-A) and a reduced volume (V1-A). Although two positions of piston 512 corresponding to height (H1) and reduced height (H1-A) are shown, it should be understood that piston 512 may be driven by actuator 510 to any position between height (H1) and height (H1-A) to achieve any volume within V1-V1-A, as desired. In this aspect, attenuator 116A-1 has a tunable chamber size that can be used to fine tune the frequency of each block within the band stop bandwidth as previously discussed. In addition, it is contemplated that piston 512 and valve 506 may be used alone or in combination to tune the body portion 502 and/or neck portion 504 as desired.

Figure 6:
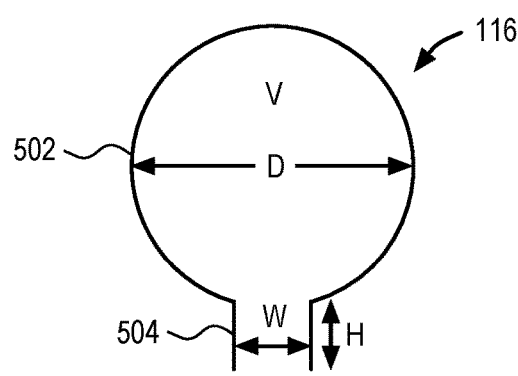
FIG. 6 illustrates a cross-sectional side view of one aspect of an attenuator.

Referring now to FIG. 6, FIG. 6 illustrates another attenuator configuration. Attenuator 116 of FIG. 6 may be similar to the previously discussed attenuator 116A-1 in that it includes a body portion 502 and a neck portion 504. In this aspect, however, body portion 502 may be round, circular or otherwise have the shape of a sphere having a diameter (D). Neck portion 504 may be similar to the previously discussed neck portion and have a width dimension (W) and a height dimension (H). The neck portion 504 may be narrower than the body portion 502 (e.g., W<D). The neck portion 504 together with the body portion 502 may define the volume (V) of the attenuator 116. Similar to the previously discussed configurations, at least one of the dimensions of the body portion 502 and/or neck portion 504 may be selected, or adjusted, to achieve a volume (V) that absorbs a desired frequency range. For example, in some aspects, the diameter (D) of the body portion 502 and/or the width dimension (W) or height dimension (H) of the neck portion may be selected and/or changed to achieve a desired volume (V) for attenuating a particular frequency range. In addition, although not shown, a valve (e.g., valve 506) or piston (e.g., piston 512) may be connected to the neck 504 and/or body portion 502 to tune the width or volume as previously discussed.

Figure 7:
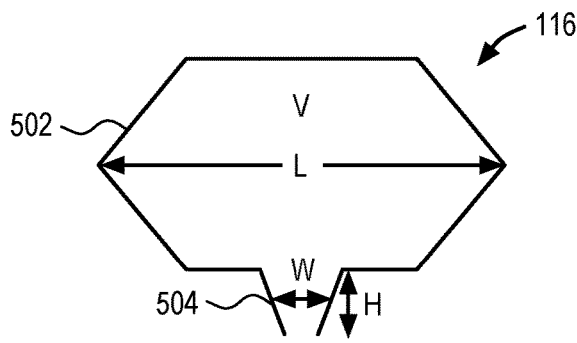
FIG. 7 illustrates a cross-sectional side view of one aspect of an attenuator.

Referring now to FIG. 7, FIG. 7 illustrates another attenuator configuration. Attenuator 116 of FIG. 7 may be similar to the previously discussed attenuator 116A-1 in that it includes a body portion 502 and a neck portion 504. In this aspect, however, body portion 502 may have another geometry, for example, a polyhedron having any number of sides and/or faces defining a length dimension (L), a height dimension and a width dimension. Neck portion 504 may be similar to the previously discussed neck portion and have a width dimension (W) and a height dimension (H). Neck portion 504 may further have a tapered shape such that it is wider at the end that connects to the body portion 502, than the end that opens to the acoustic pathway or port. Overall, however, the neck portion 504 may be narrower than the body portion 502 (e.g., W<L). The neck portion 504 together with the body portion 502 may define the volume (V) of the attenuator 116. Similar to the previously discussed configurations, at least one of the dimensions of the body portion 502 and/or neck portion 504 may be selected, or adjusted, to achieve a volume (V) that absorbs a desired frequency range. For example, in some aspects, the length dimension (L), height dimension or width dimension of the body portion 502 and/or the width dimension (W) or height dimension (H) of the neck portion may be selected and/or changed to achieve a desired volume (V) for attenuating a particular frequency range. In addition, although not shown, a valve (e.g., valve 506) or piston (e.g., piston 512) may be connected to the neck 504 and/or body portion 502 to tune the width or volume as previously discussed.

Figure 8:
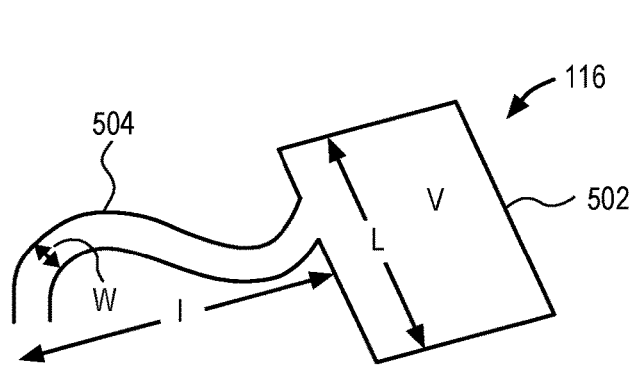
FIG. 8 illustrates a cross-sectional side view of one aspect of an attenuator.

Referring now to FIG. 8, FIG. 8 illustrates another attenuator configuration. Attenuator 116 of FIG. 8 may be similar to the previously discussed attenuator 116A-1 in that it includes a body portion 502 and a neck portion 504. In this aspect, however, neck portion 504 is relatively long, and may be windy, curved or otherwise have a bend do it and therefore have a relatively long length dimension (1). Similar to the previously discussed neck portions, neck portion 504 may also have a width dimension (W). The neck portion 504 may be narrower than the body portion 502 (e.g., W<L). The neck portion 504 together with the body portion 502 may define the volume (V) of the attenuator 116. Similar to the previously discussed configurations, at least one of the dimensions of the body portion 502 and/or neck portion 504 may be selected, or adjusted, to achieve a volume (V) that absorbs a desired frequency range. For example, in some aspects, the length dimension (L) of the body portion 502 and/or the width dimension (W) or length dimension (1) of the neck portion may be selected and/or changed to achieve a desired volume (V) for attenuating a particular frequency range. In addition, although not shown, a valve (e.g., valve 506) or piston (e.g., piston 512) may be connected to the neck 504 and/or body portion 502 to tune the width or volume as previously discussed.

Figure 9:
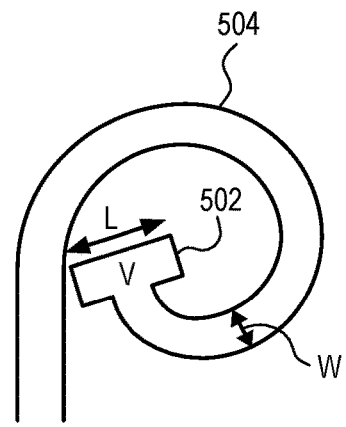
FIG. 9 illustrates a cross-sectional side view of one aspect of an attenuator.

Referring now to FIG. 9, FIG. 9 illustrates another attenuator configuration. Attenuator 116 of FIG. 9 may be similar to the previously discussed attenuator 116A-1 in that it includes a body portion 502 and a neck portion 504. In this aspect, however, neck portion 504 may curve or spiral inward and therefore have a relatively long length dimension (1) similar to the previously discussed configuration of FIG. 8. Similar to the previously discussed neck portions, neck portion 504 may also have a width dimension (W). The neck portion 504 may be narrower than the body portion 502 (e.g., W<L). The neck portion 504 together with the body portion 502 may define the volume (V) of the attenuator 116. Similar to the previously discussed configurations, at least one of the dimensions of the body portion 502 and/or neck portion 504 may be selected, or adjusted, to achieve a volume (V) that absorbs a desired frequency range. For example, in some aspects, the length dimension (L) of the body portion 502 and/or the width dimension (W) or length dimension (1) of the neck portion may be selected and/or changed to achieve a desired volume (V) for attenuating a particular frequency range. In addition, although not shown, a valve (e.g., valve 506) may be connected to the neck 504 to control an opening and closing of the neck as previously discussed.

In addition, in some aspects, the number and/or spatial arrangement of the attenuators in the array can be tuned in such a manner that a larger number of attenuators 116 can be allocated to attenuate more within a narrower band of the whole attenuator bandwidth. This is useful to suppress different amplitude of peaks within different frequency range. For example, within 20-30 kHz, the attenuation can target ~15 dB, whereas within 30-75 kHz, attenuation can target ~10 dB or vice versa.

Figure 10:
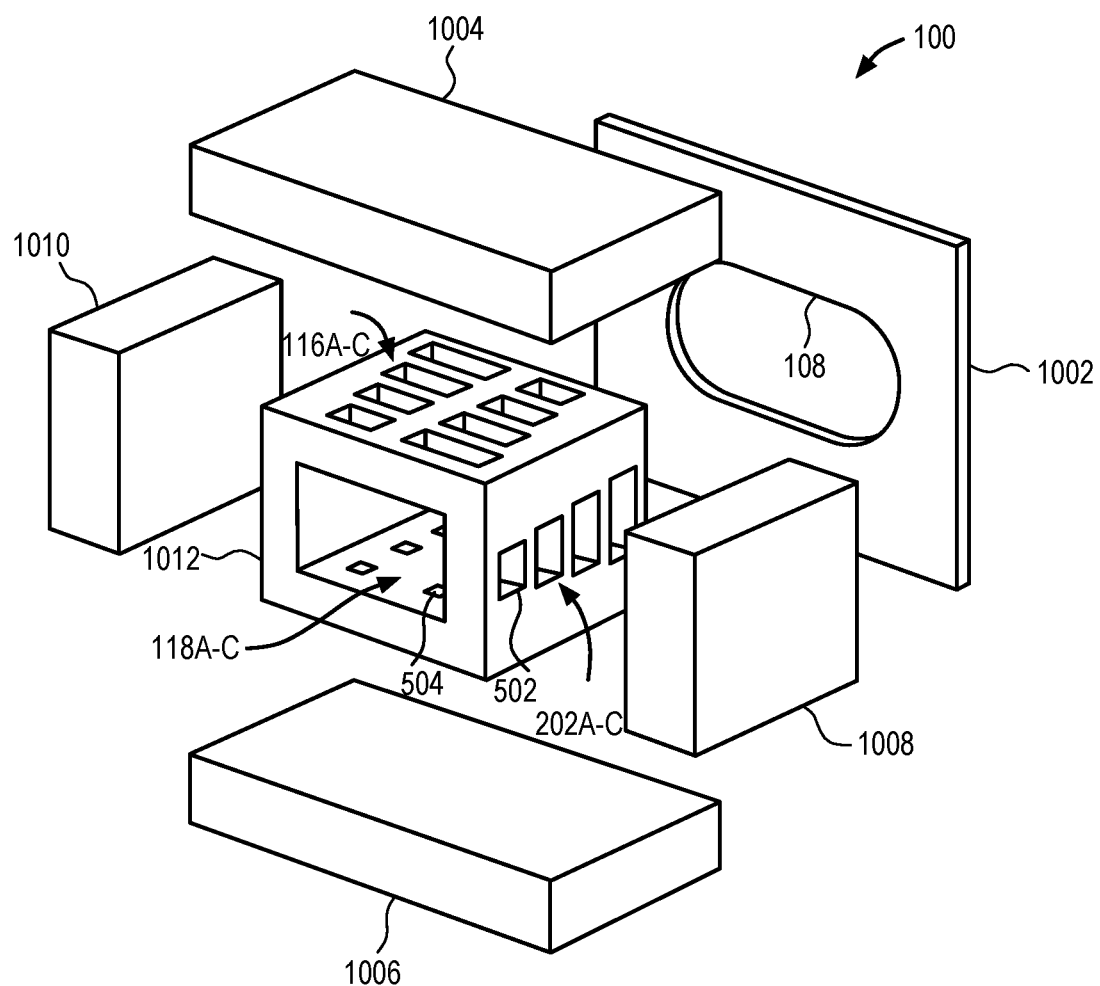
FIG. 10 illustrates an exploded perspective view of a process for assembling an arrangement of attenuators for a transducer assembly.

FIG. 10 illustrates an exploded perspective view of one representative process for assembling an arrangement of attenuators for a transducer assembly. Representatively, FIG. 10 illustrates a device or assembly 100 including a number of preformed parts or pieces 1002, 1004, 1006, 1008, 1010, 1012 that once assembled, form an arrangement of attenuators as previously discussed. Any one or more of the preformed parts or pieces 1002, 1004, 1006, 1008, 1010, 1012 may be made of, or made from, any material suitable for forming an attenuator configured to absorb desired frequency ranges. Representatively, the preformed parts or pieces 1002, 1004, 1006, 1008, 1010, 1012 may be made of a material including, but not limited to, silicon, plastic, glass or any other material suitable for forming attenuators configured to absorb desired frequency ranges as disclosed herein. Referring now in more detail to each of the parts or pieces, it can be seen from FIG. 10 that part 1002 may be a plate or other similar piece that includes the previously discussed acoustic port 108 formed therein. Part 1012 may be a hollow block or cube like structure with open ends that includes attenuator cavities 116A-C, 118A-C, 202A-C formed therein on different sides of the block. Each of the attenuators cavities 116A-C, 118A-C, 202A-C may have a same size and shape as the attenuators 116, 118, 202 previously discussed in reference to FIG. 2 such that upon completion of the assembly, the previously discussed attenuators 116, 118, 202 are formed. For example, attenuator cavities 116A-C may be formed in a first or top side of the block (e.g., first side 110A), attenuator cavities 118A-C may be formed in a second or bottom side of the block (e.g., second side 110B), and attenuator cavities 202A-C may be formed in one or both of the lateral sides of the block (e.g., third and fourth sides 110C-D) connecting the first and second sides. The attenuator cavities 116A-C, 118A-C, 202A-C may be formed in the part 1012 such that they have neck portions (e.g., neck portions 504) open to the interior or inside of the block and body portions (e.g., body portions 502) open to the exterior or outside of the block. The hollow inside of the block may define the acoustic pathway 110 to/from acoustic port 108 as previously discussed. Parts 1004, 1006, 1008, 1010 may be solid plates or blocks that are configured to attach to the exterior or outside surfaces of part 1012. In particular, part 1004 may be considered a top plate or block that attaches to the top exterior surface of part 1012 (e.g., the side including attenuator cavities 116A-C). Part 1006 may be considered a bottom plate or block that attaches to the bottom exterior surface of part 1012 (e.g., the side including attenuator cavities 118A-C). Parts 1008 and 1010 may be considered side plates or blocks that attach to the exterior side surfaces of part 1012 (e.g., the sides including attenuator cavities 202A). The parts 1004, 1006, 1008, 1010 may be attached using any suitable attachment mechanism (e.g., chemical adhesive, laser welding, mechanical, MEMS processing, or the like). The attachment of parts 1004, 1006, 1008, 1010 to the sides of the part 1012 seals the side of the attenuator cavities 116A-C, 118A-C, 202A-C open on the exterior side of part 1012 to form the enclosed body portion (e.g., body portion 502) of attenuators 116, 118, 202 previously discussed in reference to FIG. 2. The assembly 100 having attenuators 116, 118, 202 formed therein may then be coupled to a transducer, or otherwise form a part of the transducer assembly, as previously discussed in reference to FIG. 2.

Figure 11:
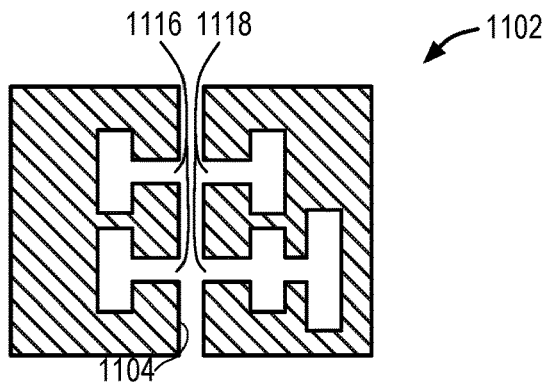
FIG. 11 illustrates a cross-sectional side view of another process for assembling an arrangement of attenuators for a transducer assembly.

FIG. 11 illustrates a cross-sectional side view of another process for assembling an arrangement of attenuators for a transducer assembly. Similar to the attenuator assembly described in reference to FIG. 10, assembly 1102 includes a preformed piece or part having an arrangement of attenuators 1116, 1118 formed therein. The arrangement of attenuators 1116, 1118 may open to an acoustic pathway or port 1104 to attenuate desired ultrasonic acoustic waves therein. The arrangement of attenuators 1116, 1118, and each of the attenuators making up the arrangement, may be substantially similar to the arrangement of attenuators 116, 118 described in reference to FIG. 2. In some aspects, due to the small size of the attenuators within the attenuator assembly (e.g., 0.2 cm or less), the attenuators may be considered micro-attenuators. In addition, the assembly 1102 may be manufactured separately from the other transducer components and therefore be considered a modular, separate or insert piece including the assembly of attenuators or micro-attenuators. Assembly 1102 may be made of a material including, but not limited to, silicon, plastic, glass or any other material suitable for forming attenuators. The preformed assembly 1102 can then be integrated into the transducer assembly port or acoustic pathway of the transducer in a number of different ways to attenuate the desired frequency ranges as previously discussed.

Figure 12:
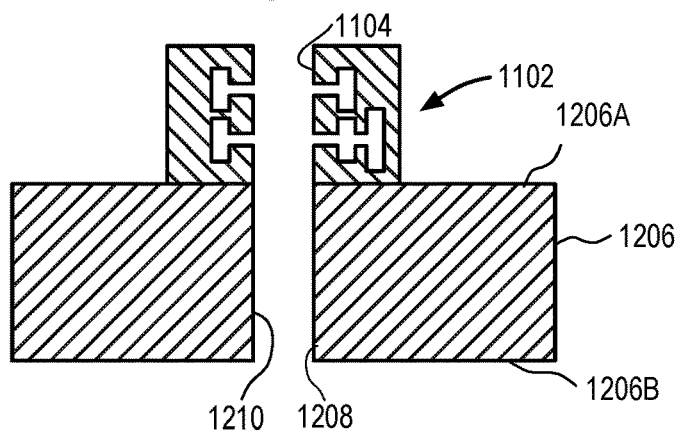
FIG. 12 illustrates a cross-sectional side view of another process for assembling an arrangement of attenuators for a transducer assembly.

For example, as illustrated by FIG. 12, in one aspect, assembly 1102 can be attached to a top side 1206A of a transducer substrate 1206. The transducer substrate 1206 may be any portion of the transducer forming an acoustic port 1208 and/or acoustic pathway 1210 to/from the associated transducer (e.g., transducer 112). In addition, it should be understood that although structure 1206 is referred to as a substrate, the structure could be any portion of an enclosure or module wall to which the transducer is coupled or integrated within. The attachment of assembly 1102 to the top side 1206A of substrate 1206 as shown aligns the acoustic pathway or port 1104 of assembly 1102 with the acoustic port 1208 and acoustic pathway 1210 of the substrate 1206. This, in turn, acoustically couples the arrangement of attenuators 1116, 1118 formed within assembly 1102 with the port 1208 and/or pathway 1210 to the transducer and allows for attenuation of acoustic waves traveling through the port/pathways, as previously discussed. Assembly 1102 may be attached to substrate 1206 using any suitable attachment mechanism (e.g., chemical, laser welding, mechanical, MEMS processing, or the like). In addition, it should be understood that although assembly 1102 is shown attached to a top side 1206A of substrate 1206, it is contemplated that assembly 1102 could be attached to a bottom side 1206B and aligned with the opposite end of port/pathways 1208, 1210, or attached to any surface of the substrate 1206 suitable for acoustically coupling the attenuators 1116, 1118 to the transducer port or pathway.

Figure 13:
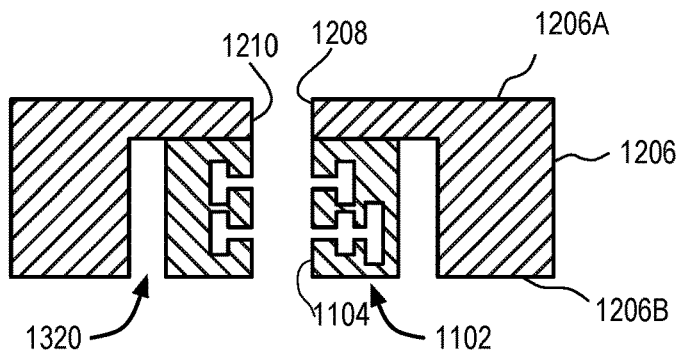
FIG. 13 illustrates a cross-sectional side view of another process for assembling an arrangement of attenuators for a transducer assembly.

In another aspect, assembly 1102 may be attached within a cavity formed in the substrate as shown in FIG. 13. For example, as illustrated by FIG. 13, in one aspect, assembly 1102 can be positioned within a cavity 1320 formed in the bottom side 1206B of transducer substrate 1206. The attachment of assembly 1102 to a wall of the cavity 1320 of substrate 1206 as shown aligns the acoustic pathway or port 1104 of assembly 1102 with the acoustic port 1208 and acoustic pathway 1210 of the substrate 1206. This, in turn, acoustically couples the arrangement of attenuators 1116, 1118 formed within assembly 1102 with the port 1208 and/or pathway 1210 to the transducer and allows for attenuation of acoustic waves traveling through the port/pathways, as previously discussed. Assembly 1102 may be attached to a wall of the cavity 1320 within substrate 1206 using any suitable attachment mechanism (e.g., chemical, laser welding, mechanical, MEMS processing, or the like). In addition, it should be understood that although cavity 1320 is shown formed in a bottom side 1206B of substrate 1206, it is contemplated that assembly 1102 could be attached to a cavity formed within the top side 1206A and aligned with the opposite end of port/pathways 1208, 1210.

Figure 14:
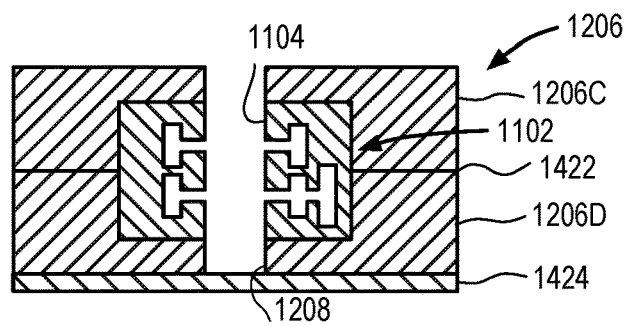
FIG. 14 illustrates a cross-sectional side view of another process for assembling an arrangement of attenuators for a transducer assembly.

In still further aspects, assembly 1102 may be embedded within the substrate as shown in FIG. 14. For example, as illustrated by FIG. 14, in one aspect, assembly 1102 may be embedded between a top portion 1206C and a bottom portion 1206D of substrate 1206. For example, substrate 1206 may include a top portion 1206C and a bottom portion 1206D that are assembled around a top and bottom of assembly 1102 such that assembly 1102 is considered embedded within substrate 1206. The attachment of assembly 1102 within substrate 1206 as shown aligns the acoustic pathway or port 1104 of assembly 1102 with the acoustic port 1208 and acoustic pathway 1210 of the substrate 1206. This, in turn, acoustically couples the arrangement of attenuators 1116, 1118 formed within assembly 1102 with the port 1208 and/or pathway 1210 to the transducer and allows for attenuation of acoustic waves traveling through the port/pathways, as previously discussed. In some aspects, the top and bottom portions 1206C and 1206D may be attached to one another at seam 1422, and assembly 1102, using a laser welding process, or any other suitable attachment process. In addition, in some aspects, a membrane 1424 may be positioned over port 1208 by attaching it to a side of substrate 1206. The side may be the side of substrate 1206 facing the ambient environment when the transducer is assembled. The membrane 1424 could be an acoustically transparent membrane configured to protect portion port 1208 or a tuning membrane configured to enhance attenuation or sound input/output of the transducer coupled thereto. Representatively, membrane 1424 could be a polytetrafluoroethylene (PTFE) membrane.

Figure 15:
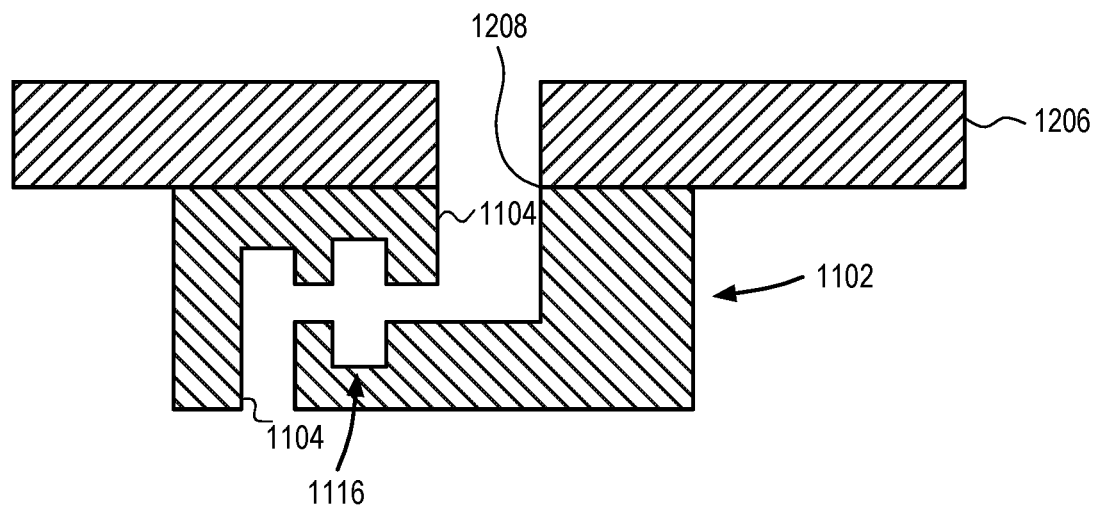
FIG. 15 illustrates a cross-sectional side view of another process for assembling an arrangement of attenuators for a transducer assembly.

Referring now to FIG. 15, FIG. 15 illustrates another possible attenuator arrangement that can be integrated into the preformed assembly 1102. Representatively, FIG. 15 illustrates a preformed assembly 1102 in which one or more of the attenuators 1116 are offset, or otherwise not in line with, the port 1208 of substrate 1206. For example, one or more of attenuators 1116 may be formed within a left or a right side of assembly 1102 and then have a longer pathway and/or port 1104 that acoustically connects attenuators 1116 to port 1208 of substrate 1206. In addition, a pathway and/or port 1104 may also be formed through an opposite side of assembly 1102 and offset from port 1208 such that the attenuators 1116 are between the two ports 1104.

Figure 16:
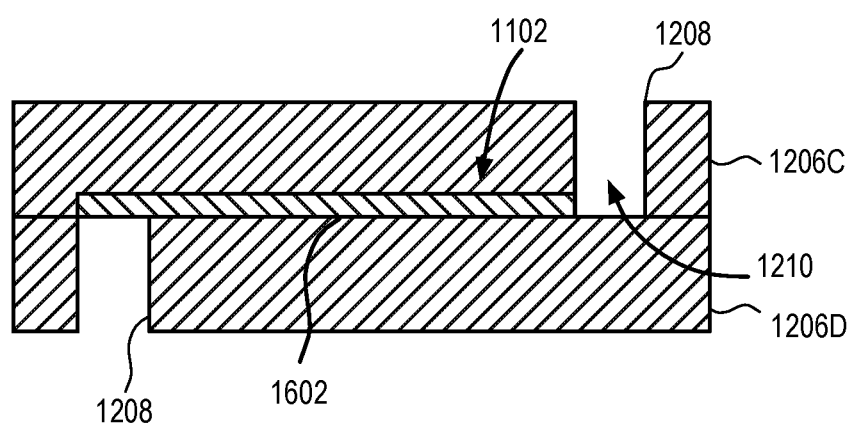
FIG. 16 illustrates a cross-sectional side view of another process for assembling an arrangement of attenuators for a transducer assembly.

Referring now to FIG. 16, in still another aspect, assembly 1102 may be positioned between a top portion 1206C and a bottom portion 1206D of substrate 1206 within a relatively long inductive channel 1602 formed between portions 1206C-D and ports 1208. For example, assembly 1102 may be positioned within the relatively long channel 1602 and then the top portion 1206C and a bottom portion 1206D may be attached to one another as previously discussed. It should be understood that although not shown for ease if illustration, assembly 1102 includes an arrangement of attenuators 1116 that are acoustically coupled to the ports 1208 to absorb desired sound waves traveling between ports 1208 as previously discussed. Alternatively, it is contemplated that in some aspects, attenuators could be directly formed within each of the interfacing surfaces of the top portion 1206C and bottom portion 1206D instead of positioning a separate assembly 1102 within channel 1602.

Figure 17:
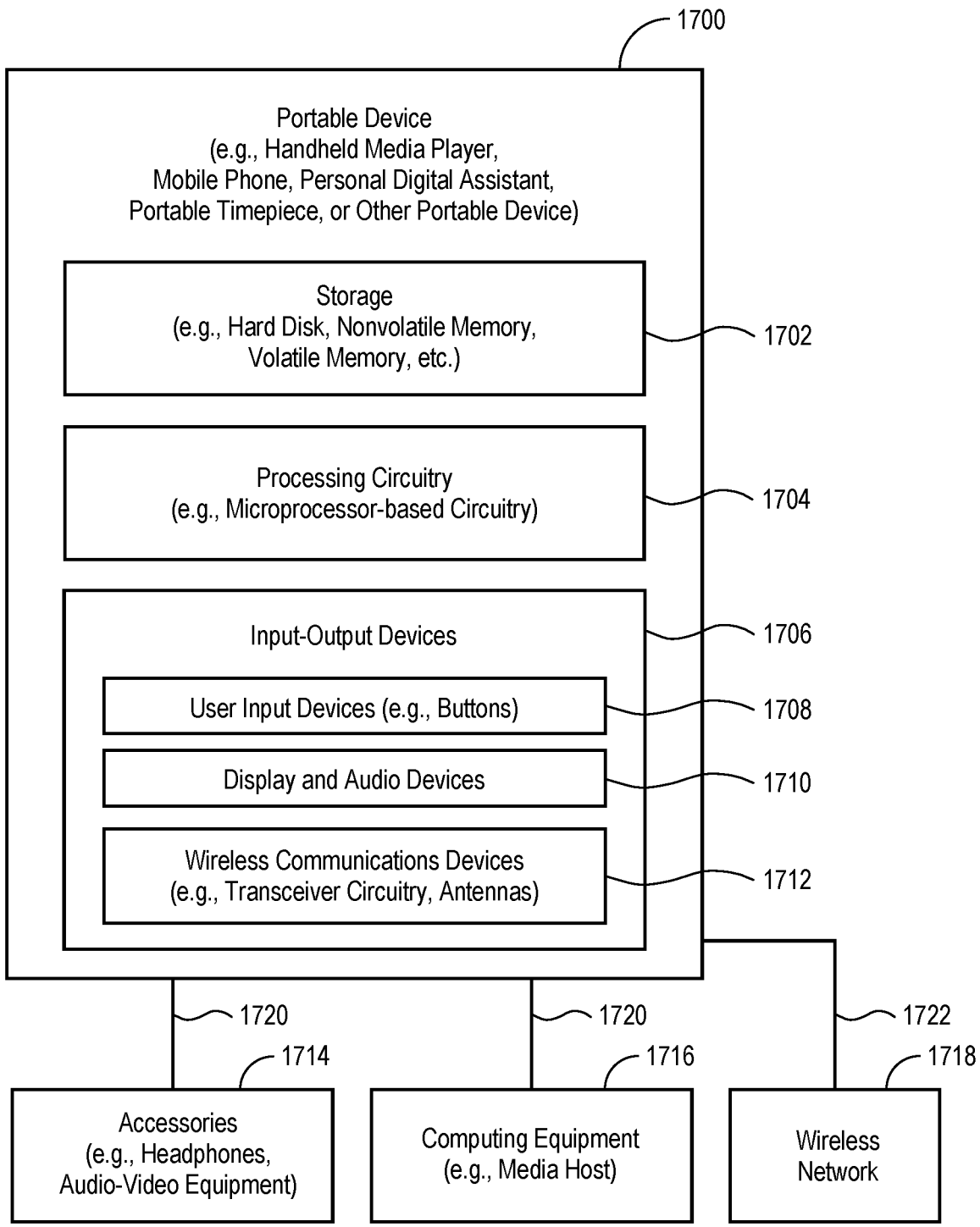
FIG. 17 illustrates a block diagram of one aspect of an electronic device within which the array of attenuators of FIG. 1-FIG. 16 may be implemented.

FIG. 17 illustrates a block diagram of one aspect of an electronic device within which the previously discussed speaker may be implemented. As shown in FIG. 17, device 1700 may include storage 1702. Storage 1702 may include one or more different types of storage such as hard disk drive storage, nonvolatile memory (e.g., flash memory or other electrically-programmable-read-only memory), volatile memory (e.g., battery-based static or dynamic random-access-memory), etc.

Processing circuitry 1704 may be used to control the operation of device 1700. Processing circuitry 1704 may be based on a processor such as a microprocessor and other suitable integrated circuits. With one suitable arrangement, processing circuitry 1704 and storage 1702 are used to run software on device 1700, such as internet browsing applications, voice-over-internet-protocol (VOIP) telephone call applications, email applications, media playback applications, operating system functions, etc. Processing circuitry 1704 and storage 1702 may be used in implementing suitable communications protocols. Communications protocols that may be implemented using processing circuitry 1704 and storage 1702 include internet protocols, wireless local area network protocols (e.g., IEEE 802.11 protocols—sometimes referred to as Wi-Fi®), protocols for other short-range wireless communications links such as the Bluetooth® protocol, protocols for handling 3G or 4G communications services (e.g., using wide band code division multiple access techniques), 2G cellular telephone communications protocols, etc.

To minimize power consumption, processing circuitry 1704 may include power management circuitry to implement power management functions. For example, processing circuitry 1704 may be used to adjust the gain settings of amplifiers (e.g., radio-frequency power amplifier circuitry) on device 1700. Processing circuitry 1704 may also be used to adjust the power supply voltages that are provided to portions of the circuitry on device 1700. For example, higher direct-current (DC) power supply voltages may be supplied to active circuits and lower DC power supply voltages may be supplied to circuits that are less active or that are inactive. If desired, processing circuitry 1704 may be used to implement a control scheme in which the power amplifier circuitry is adjusted to accommodate transmission power level requests received from a wireless network.

Input-output devices 1706 may be used to allow data to be supplied to device 1700 and to allow data to be provided from device 1700 to external devices. Display screens, microphone acoustic ports, speaker acoustic ports, and docking ports are examples of input-output devices 1706. For example, input-output devices 1706 can include user input-output devices 1708 such as buttons, touch screens, joysticks, click wheels, scrolling wheels, touch pads, key pads, keyboards, microphones, cameras, etc. A user can control the operation of device 1700 by supplying commands through user input devices 1708. Display and audio devices 1710 may include liquid-crystal display (LCD) screens or other screens, light-emitting diodes (LEDs), and other components that present visual information and status data. Display and audio devices 1710 may also include audio equipment such as speakers and other devices for creating sound. Display and audio devices 1710 may contain audio-video interface equipment such as jacks and other connectors for external headphones and monitors.

Wireless communications devices 1712 may include communications circuitry such as radio-frequency (RF) transceiver circuitry formed from one or more integrated circuits, power amplifier circuitry, passive RF components, antennas, and other circuitry for handling RF wireless signals. Wireless signals can also be sent using light (e.g., using infrared communications). Representatively, in the case of a speaker acoustic port, the speaker may be associated with the port and be in communication with an RF antenna for transmission of signals from the far end user to the speaker.

Returning to FIG. 17, device 1700 can communicate with external devices such as accessories 1714, computing equipment 1716, and wireless network 1718 as shown by paths 1720 and 1722. Paths 1720 may include wired and wireless paths. Path 1722 may be a wireless path. Accessories 1714 may include headphones (e.g., a wireless cellular headset or audio headphones) and audio-video equipment (e.g., wireless speakers, a game controller, or other equipment that receives and plays audio and video content), a peripheral such as a wireless printer or camera, etc.

Computing equipment 1716 may be any suitable computer. With one suitable arrangement, computing equipment 1716 is a computer that has an associated wireless access point (router) or an internal or external wireless card that establishes a wireless connection with device 1700. The computer may be a server (e.g., an internet server), a local area network computer with or without internet access, a user's own personal computer, a peer device (e.g., another portable electronic device), or any other suitable computing equipment.

Wireless network 1718 may include any suitable network equipment, such as cellular telephone base stations, cellular towers, wireless data networks, computers associated with wireless networks, etc. For example, wireless network 1718 may include network management equipment that monitors the wireless signal strength of the wireless handsets (cellular telephones, handheld computing devices, etc.) that are in communication with network 1718.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting. For example, although a speaker is specifically disclosed herein, the valve disclosed herein could be used with other types of transducers, for example, microphones. Still further, although a portable electronic device such as a mobile communications device is described herein, any of the previously discussed valve and transducer configurations may be implemented within a tablet computer, personal computer, laptop computer, notebook computer, headphones and the like. In addition, to aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. An acoustic device comprising:
an enclosure defining an acoustic port and an acoustic pathway between the acoustic port and a transducer coupled to the enclosure; and
an array of attenuators acoustically coupled to the acoustic pathway, the array of attenuators comprising a first attenuator dimensioned to absorb ultrasonic acoustic waves within a first ultrasonic frequency range and a second attenuator dimensioned to absorb ultrasonic acoustic waves within a second different ultrasonic frequency range.

2. The acoustic device of claim 1 wherein the array of attenuators comprises a first series of attenuators comprising the first attenuator and the second attenuator arranged by volume and a second series of attenuators arranged by volume in inverse order to that of the first series of attenuators.

3. The acoustic device of claim 1 wherein the array of attenuators comprises a first series of attenuators comprising the first attenuator and the second attenuator arranged by a frequency of ultrasonic acoustic waves they are dimensioned to absorb and a second series of attenuators arranged by a frequency of ultrasonic acoustic waves they are dimensioned to absorb in inverse order to the first series of attenuators.

4. The acoustic device of claim 1 wherein the array of attenuators comprises a first series of attenuators comprising the first attenuator and the second attenuator arranged by a length dimension and a second series of attenuators arranged by a length dimension in inverse order to that of the first series of attenuators.

5. The acoustic device of claim 4 wherein the first series of attenuators are arranged in a first column by increasing length and the second series of attenuators are arranged in a second column adjacent to the first column by decreasing length.

6. The acoustic device of claim 1 wherein each of the attenuators of the array of attenuators comprise a body portion acoustically coupled to the acoustic pathway by a neck portion, and wherein a length dimension of the body portion of each of the attenuators is different from that of an adjacent attenuator.

7. The acoustic device of claim 6 wherein the length dimension is at least ten times smaller than at least one of the ultrasonic acoustic waves.

8. The acoustic device of claim 6 further comprising a piston coupled to the body portion or a valve coupled to the neck portion to tune a size of the body portion or the neck portion.

9. The acoustic device of claim 1 wherein the array of attenuators comprises a first column of attenuators comprising the first attenuator and the second attenuator, a second column of attenuators arranged in an inverse order to the first column of attenuators, and a third column of attenuators arranged in an inverse order to the second column of attenuators.

10. The acoustic device of claim 1 wherein the array of attenuators is a first array of attenuators acoustically coupled to a first side of the acoustic pathway, and the device further comprises a second array of attenuators acoustically coupled to a second side of the acoustic pathway.

11. The acoustic device of claim 1 wherein the transducer is a microphone and the array of attenuators absorbs ultrasonic acoustic waves within a frequency range of from 20 kHz to 100 kHz.

12. An acoustic attenuator comprising:
an enclosure defining an acoustic pathway; and
a first series of attenuators and a second series of attenuators asymmetrically arranged relative to one another along the acoustic pathway, and the first series of attenuators or the second series of attenuators having a first attenuator dimensioned to absorb ultrasonic acoustic waves within a first ultrasonic frequency range and a second attenuator dimensioned to absorb ultrasonic acoustic waves within a second different ultrasonic frequency range.

13. The acoustic attenuator of claim 12 wherein the first series of attenuators and the second series of attenuators each comprise a first attenuator dimensioned to absorb ultrasonic acoustic waves within a first ultrasonic frequency range and a second attenuator dimensioned to absorb ultrasonic acoustic waves within a second ultrasonic frequency range, and the first attenuator and the second attenuator of the first series of attenuators are in inverse order to that of the first attenuator and the second attenuator of the second series of attenuators.

14. The acoustic attenuator of claim 12 wherein the first series of attenuators comprises the first attenuator and the second attenuator arranged according to a length dimension and each of the attenuators of the second series of attenuators are arranged according to a length dimension in an order inverse to that of the first series of attenuators.

15. The acoustic attenuator of claim 14 where the first series of attenuators and the second series of attenuators are arranged along a first side of the acoustic pathway, and the attenuator further comprises a third series of attenuators arranged along the first side of the acoustic pathway in an order inverse to that of the second series of attenuators.

16. The acoustic attenuator of claim 15 further comprising a fourth series of attenuators and a fifth series of attenuators arranged along a second side of the acoustic pathway.

17. The acoustic device of claim 1 wherein the array of attenuators comprise a first series of attenuators and a second series of attenuators asymmetrically arranged relative to one another along the acoustic pathway.

18. The acoustic device of claim 17 where the first series of attenuators and the second series of attenuators are arranged along a first side of the acoustic pathway, and the array of attenuators further comprises a third series of attenuators arranged along the first side of the acoustic pathway in an order inverse to that of the second series of attenuators.

19. The acoustic device of claim 18 further comprising a fourth series of attenuators and a fifth series of attenuators arranged along a second side of the acoustic pathway.

20. The acoustic device of claim 1 wherein the first attenuator and the second attenuator comprise Helmholtz resonators formed within a substrate defining the acoustic pathway, wherein the Helmholtz resonators are dimensioned to absorb ultrasonic acoustic waves within the first ultrasonic frequency range and the second different ultrasonic frequency range.

* * * * *